(12) United States Patent
Emmot et al.

(10) Patent No.: US 7,350,127 B2
(45) Date of Patent: Mar. 25, 2008

(54) ERROR CORRECTION METHOD AND SYSTEM

(75) Inventors: Darel N. Emmot, Fort Collins, CO (US); Asheesh Kashyap, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 549 days.

(21) Appl. No.: 10/735,128

(22) Filed: Dec. 12, 2003

(65) Prior Publication Data

US 2005/0132259 A1    Jun. 16, 2005

(51) Int. Cl.
*H03M 13/00* (2006.01)

(52) U.S. Cl. ..................................... 714/752

(58) Field of Classification Search ............... 714/752
See application file for complete search history.

(56) References Cited

U.S. PATENT DOCUMENTS

| 5,459,850 | A | * | 10/1995 | Clay et al. ................. 711/171 |
| 6,047,069 | A | | 4/2000 | Hogan |
| 6,212,647 | B1 | | 4/2001 | Sims, III et al. |

* cited by examiner

*Primary Examiner*—Guy J. Lamarre

(57) ABSTRACT

An error correction code method comprises examining a validator of one of a plurality of data in a data stream at a first processing stage and directing the one of the plurality of data through at least one subsequent processing stage to a corrected output if the validator indicates an error. The method also includes directing the one of the plurality of data to the corrected output if the validator does not indicate an error.

22 Claims, 3 Drawing Sheets

ERROR CORRECTION METHOD AND SYSTEM

TECHNICAL FIELD OF THE INVENTION

The present invention relates generally to the field of communications and, more specifically, to an error correction method and system.

BACKGROUND OF THE INVENTION

As technology becomes increasingly more sophisticated, consumers rely on software, hardware, and scientific methods more and more. For example, most consumers own a ubiquitous personal computer (PC), and many own wireless devices such as personal digital assistants (PDAs). Moreover, nearly all businesses utilize computers in one form or another in conducting their business, whether local, national or global in nature. Thus, technology users must be able to rely on the devices that they use every day.

Developments in communications and data storage introduced error correction coding (ECC) algorithms that may detect errors such as random bit error, burst error and/or erasure of data. Some of these algorithms may, in some cases, correct for one or more of these detected error types. Such ECC algorithms are frequently used in applications where dynamic random access memory (DRAM) is used. Unfortunately, while error correction is advantageous and desirable, it usually comes at a significant latency in returning correct data. Thus, most users needing reliable access to data must sacrifice processing speed for accuracy.

SUMMARY OF THE INVENTION

One embodiment of the present invention is an error correction code method. The method comprises examining a validator of one of a plurality of data in a data stream at a first processing stage and directing the one of the plurality of data through at least one subsequent processing stage to a corrected output if the validator indicates an error. The method also includes directing the one of the plurality of data to the corrected output if the validator does not indicate an error.

Another embodiment of the present invention is an error correction code system. The system comprises a plurality of error correction code (ECC) processing stages and stage select logic coupled to each of the plurality of ECC processing stages. The logic examines a validator of one of a plurality of data in a data stream at a first of the plurality of ECC processing stages and directs the one of the plurality of data through at least one subsequent processing stage to a corrected output if the validator indicates an error. The logic directs the one of the plurality of data to the corrected output if the validator does not indicate an error.

Yet another embodiment of the present invention is error correction logic. The logic comprises a plurality of validator inputs, each indicating whether one of a plurality of data in a data stream is valid. The state select logic is operable to receive the plurality of correct signals and to examine each of the plurality of validator inputs at a first processing stage coupled to the state select logic. The logic is also operable to direct the one of the plurality of data through at least one subsequent stage coupled to the state select logic to a corrected output if one of the plurality of validator inputs indicates an error, and to direct the one of the plurality of data to the corrected output if the one of the plurality of validator inputs does not indicate an error.

Other aspects and features of the invention will become apparent to those ordinarily skilled in the art upon review of the following description of specific embodiments of the invention in conjunction with the accompanying figures.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE DRAWINGS

Figure 1:
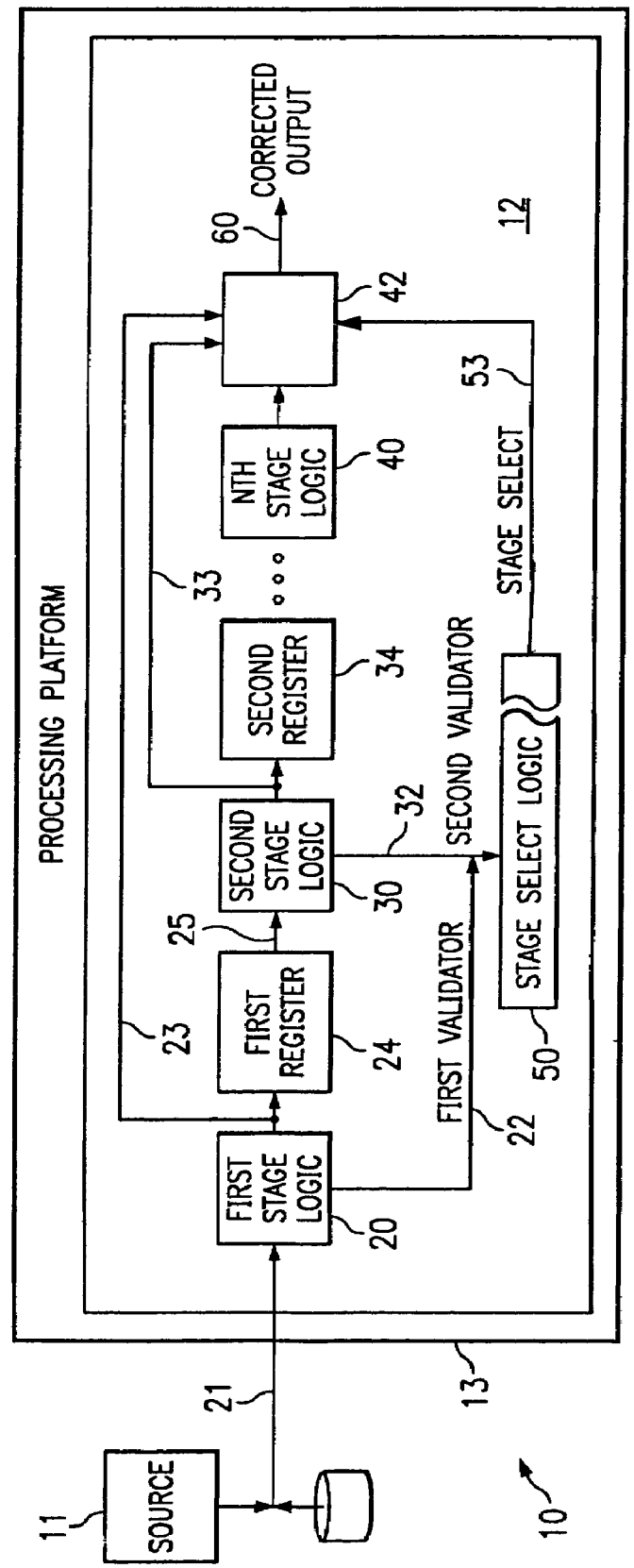
FIG. 1 is a block diagram of an embodiment of an error correction system according to the present invention.
Figure 2:
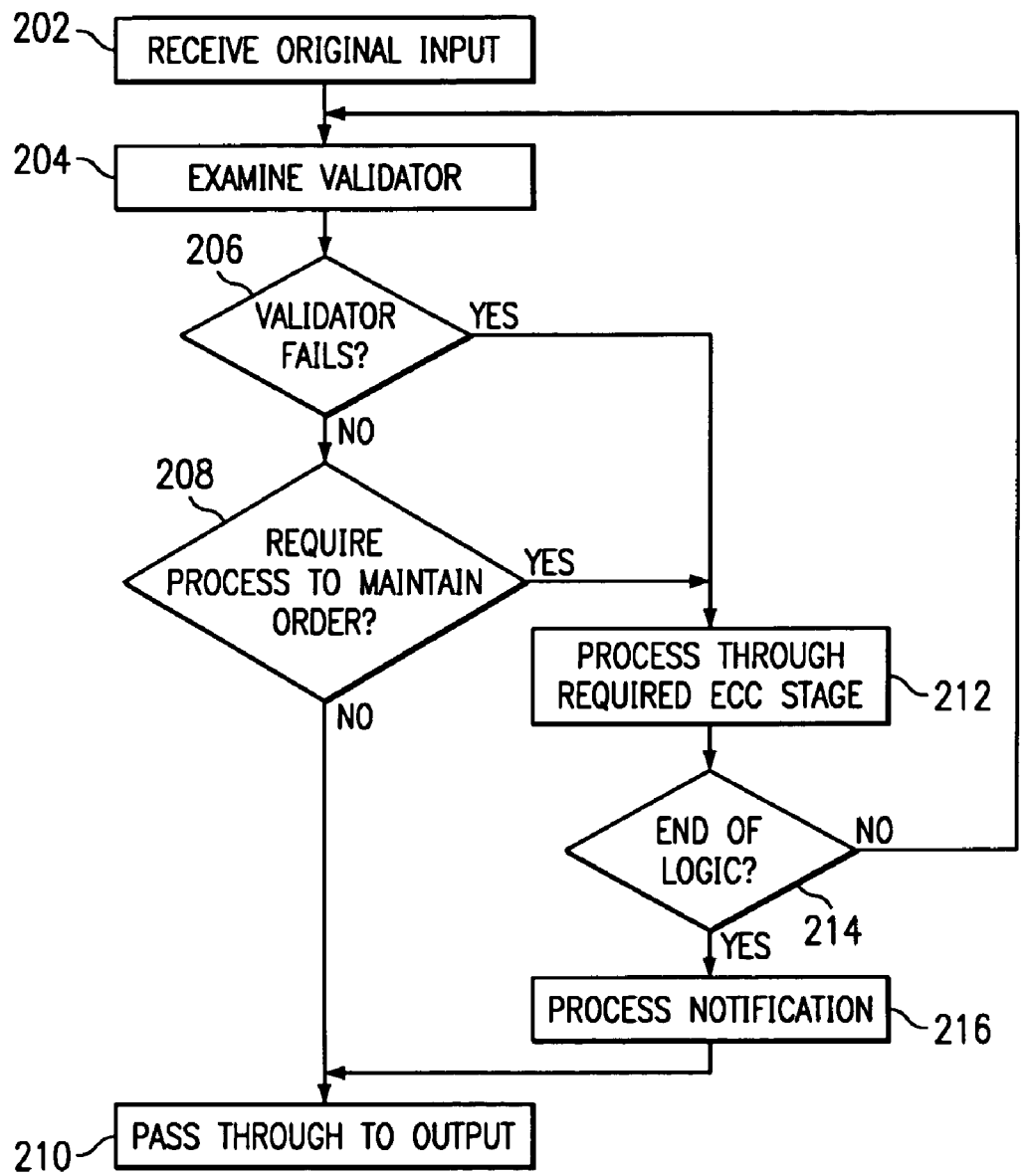
FIG. 2 illustrates an example of a method for error correction according to the present invention.
Figure 3:
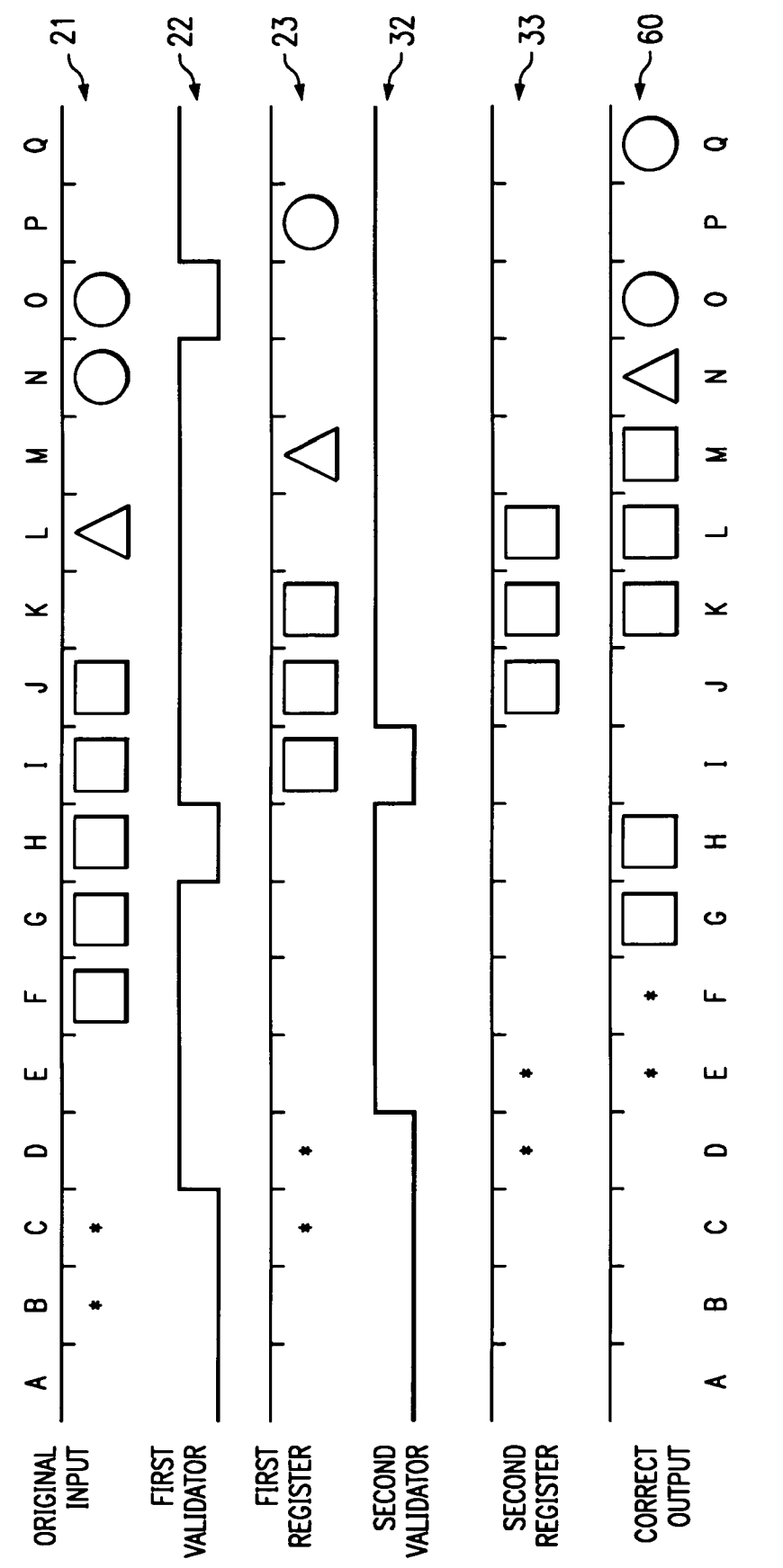
FIG. 3 graphically illustrates a representation of a plurality of data in a data stream flowing through an error correction system.

The preferred embodiment of the present invention and its advantages are best understood by referring to FIGS. 1 through 3 of the drawings. FIG. 1 is a block diagram of an embodiment of an error correction system according to the present invention. System 10 includes an error correction code (ECC) algorithm 12 that is comprised of n stages, which include logic and a register, that process an original data input stream 21 and produce a corrected output 60. State select logic 50 may be used to bypass all processing of data in original data input stream 21 that does not need error detection by the ECC algorithm, especially decoding circuitry that, in most ECC algorithms, imposes the largest time processing penalty. That is, good or valid data may exit at any stage of the processing pipeline without incurring a processing time penalty. Thus, processing occurs only when errors are present. The present system and method examine validators of a plurality of data in an incoming data stream before the data is processed by a subsequent stage in the algorithm. If a data error is detected, a valid signal will be generated only when data has been recovered and is ready to leave the processing pipeline. This process ensures that the order of the incoming data stream is maintained.

ECC algorithms have been used for a variety of applications including, but not limited to, correcting information incorrectly returned from what has been stored in a memory. In such an example, ECC algorithms are able to detect and correct whether bits read from memory have been correctly recalled. In some applications, ECC algorithms detect both single-bit and multi-bit errors by, generally, encoding information in a block of bits that contain sufficient detail to permit detection and restoration of one or more bit errors in protected data, such as memory. ECC algorithms use groupings of, for example, 7 bits or 8 bits to protect 32 or 64 bits of memory, respectively. A number of ECC algorithms are known, including the ECC algorithm as disclosed in U.S. Pat. No. 5,719,884. Although the present invention contemplates use in conjunction with a number of ECC algorithms, for ease of description, FIG. 1 will be described in conjunction with n decoding stages and, for simplicity, FIGS. 2 and 3 will be discussed in conjunction with two (2) decoding stages.

In the example illustrated in FIG. 1, ECC algorithm 12 may be operatively associated with a processing platform 13, and comprises a first stage that includes first stage logic 20 coupled to first register 24 at first output 23. ECC algorithm 12 receives original data input stream 21 from one or more sources 11 which may or may not reside in processing platform 13. First register 24 is coupled to second stage logic 30 at first output 25. Second stage logic 30 is coupled to second register 34 at output 33. First register 24 captures the result of its preceding logic stage, first stage logic 20, and second register 34 captures the result of second stage logic 30. Where additional stages are desired, these stages are similarly coupled until an nth stage logic 40 outputs its result, which is captured by selector 42. ECC algorithm 12 culminates in stage logic 40, which is coupled to a selector 42. Selector 42 receives as inputs first stage output 23, second stage output 33, . . . , and n stage select output 53, and outputs a corrected output 60. ECC algorithm 12 may include fewer or more stages of logic. In a particular embodiment, selector logically comprises a multiplexor, which may be implemented in a number of known methods, such as an AND-OR tree or a pass-gate network.

Stage select logic 50 is operable to control processing of the invalid and valid data in data stream 21 using a method similar to the one discussed in conjunction with FIG. 2, based on information created in first stage logic 20. In the method discussed in FIGS. 2 and 3, the information comprises a validator for each datum. In the example illustrated in FIG. 1, stage select logic 50 receives as inputs first validator 22, second validator 32, . . . , and an n-1 validator (not explicitly shown). These validators are used as illustrated to indicate whether a datum in data stream 21 is correct or valid, or whether the datum has an error. A validator may be provided using a number of different methods to indicate various features associated with a particular datum. For example, in some applications, a validator such as a syndrome may use validator bits as parity bits calculated using multiple techniques. These bits reveal which datum from the data stream is in error, or whether a double-bit error occurred. As a further example, a validator may be used to categorize an error. A validator may be used in some applications to index a table to determine which bits are in error, how many stages must be used to correct the error, or that the error is uncorrectable. Table lookup stages may be implemented, for example, in hardware, or in software, such as an interrupt, trap, or exception. State data may be transferred with each datum that may be examined by a validator at one or more stages. In the illustrated embodiment, nth stage logic 40 need not produce a validator, because uncorrectable errors do not affect flow of ECC algorithm 12. However, in some applications, it may be desirable to send a notification that the error is not correctable.

Depending on the embodiment, a state related to each datum created in first logic stage 20 may be isomorphically mapped to separate features such as the datum, validator, and/or other values, such as status, and the number of stages required to correct an errant datum. As illustrated in FIG. 1, these features may be captured or maintained in single registers 24 and 34. On the other hand, many other implementations are contemplated. In some applications, first stage logic 20 may deterministically determine whether an error may be corrected, and how many stages are needed to process each datum using ECC algorithm 12 in order to correct that datum. For example, first stage logic 20 may include logic to create a state comprising a function of multiple bits.

Numerous implementations for designating logic and register boundaries are also available. As one example, where it is desirable to separate these features, at one or more stages more than one register and/or logic may be used to capture and/or process the result of its preceding logic stage. To illustrate, a portion of stage select logic 50 as illustrated in FIG. 1 may be used in conjunction with register 24 after first stage logic 20, and/or another portion of stage select logic 50 may be used in conjunction with register 34 after first stage logic 30, and so on. In yet another scenario also not explicitly shown and also for example, register 24 and a portion of stage select logic 50 may be combined into a single register after first stage logic 20, and so on. In another embodiment also not explicitly shown, registers 24 and 34 and stage select logic 50 may be combined into a single logic register. In some embodiments, processing could also be improved by subdividing each stage into smaller subsystems. The number of stages to be used to perform error correction typically depends on the complexity of a chosen correction algorithm and the operating frequency of the data path containing the correction logic, which are usually options that vary on the implementation. For example, operating frequency is typically determined by system implementation choices such as clock skew, and cost and performance tradeoffs, which vary according to the application.

System 10 provides reliable error detection and correction of data from a variety of sources 11, while reducing the processing time that would otherwise be required with conventional methods and systems. The present invention contemplates a number of applications including, but not limited to, data transfer from a source 11 such as random access memory (RAM) or dynamic random access memory (DRAM) in memory applications, and data transfer from a source 11 such as a hard disk or drive. The present invention also contemplates receiving data from a source 11 such as a network element comprising a router, network switch, processing platform, wireless device or network appliance. Data transfer in communications applications is usually known as packets, in disk drives as sectors, and in memory such as DRAM or RAM, as bursts. Such a method and system may correct a variety of error types such as, but not limited to, random bit error, burst, and erasure of data that typically occur with systems that use, for example, DRAM. As DRAM size decreases, its smaller geometry increases the probability of multi-bit errors. For ease of illustration, a stream of data, whether bursts, sector or packet, is described in this description as a data stream having a plurality of data.

The present invention contemplates numerous implementations for processing platform 13. For example, in some scenarios, it may be advantageous to implement the present system and method using high-speed logic such as hardware. Such an implementation may be advantageous to read and correct errors at memory speeds, which may require on-the-fly processing. In addition to a hardware implementation, ECC algorithm 12 may also be implemented using a number of different software architectures and languages such as, but not limited to JAVA, firmware, fuzzy logic, or a combination thereof. ECC algorithms that detect and/or correct n-bits of error may be adapted to be used in conjunction with a number of operating systems such as, but not limited to, Linux, Windows, and others. In these implementations, ECC algorithm 12 may be interoperatively coupled with a processing platform 13 that comprises hardware, software, or a combination thereof.

FIG. 2 illustrates an example of a method for error correction according to the present invention. Generally, the method provides for automatically processing erroneous or invalid data in a data stream to correct the erroneous data, and processing valid data only where necessary to maintain the order of the data in the data stream. A variety of methods may be used, whether known or developed in the future.

Various embodiments may utilize fewer or more steps, and the method may be performed using a number of different implementations, depending on the application.

In step 202, an original input data stream is received. Because each individual datum may or may not be erroneous, in step 204, the method examines the validator of each datum in the data stream. In a particular embodiment, the validator may be expressed as a binary value that has a value 0 if an output of a logic stage, such as output 25 of first stage logic 20, has an error. In this scenario, the validator has a value 1 if the input is error-free, unoccupied or invalid. In a particular embodiment, the method may determine how many stages of processing are needed to correct the error. As one example, in another embodiment the validator may not be expressed as a simple binary value, but include a deterministic indication of how many processing stages are required.

The method tests for the validator passing or failing in step 206. If the validator passes, the method proceeds to step 208, where the method inquires whether processing is required to maintain the order of the datum in the original data stream. If not, the method passes the datum to the output in step 210. If further processing is required in step 208 to maintain the order of the datum in the original data stream, the method proceeds to step 212. The method also proceeds to step 212 if the validator fails in step 206.

In step 212, the method processes the datum through the required ECC stage, and then proceeds to step 214. The method then inquires in step 214 whether it has reached the end of the logic in the ECC algorithm. If not, the method then returns to step 204. If all ECC stages have been utilized, the method proceeds to step 216, where the method performs a process notification that may vary depending on the application. For example, a process notification may include examining the syndrome of the datum. Without further processing, the datum and the result of the examination in 216 proceed to step 210. Thus, if the error is not correctable, the final ECC stage will propagate the erroneous datum and, in some applications it may be desirable to send a notification of the uncorrectable error. If an error notification is not desired, step 216 may be omitted. Because uncorrectable errors do not affect flow of the ECC algorithm, the method may utilize a number of methods, either now known or developed in the future, to implement a step 216 where desired.

FIG. 3 graphically illustrates a representation of a plurality of data in a data stream flowing through an error correction system. Original input 21 represents input that may or may not include errors. In this example, for ease of illustration, data are illustrated as various datum groups represented by asterisks, squares, a triangle, and circles. For further ease of discussion, each datum in the example illustrated in FIG. 2 may be identified by its originating point A-O. In an implementation using hardware, this discussion may be facilitated by conceptualizing the input data stream as one datum per read cycle point. Thus, in the illustrated example, a first asterisk data group comprises two data B and C, denoted as asterisks. The data stream has a 'gap' from D to E (where either invalid or no data is read), which is followed by a second square data group with 5 data from F to J, denoted as squares. Another data gap at K follows the second data group, and a third triangle data group comprising a single datum at L, denoted as a triangle is followed by another gap at M. The final circle data group comprises two data at N and O, denoted as circles. For illustrative purposes, this discussion will proceed using two stages of logic based on the first two stages identified in FIG. 1. Thus, invalid data flow through either or both of first register 23, second register 33 and to correct output 60. In particular embodiments, correct output 60 may be a registered output or a combinational output. For case of illustration, FIG. 3 is discussed using a registered output. A registered output may permit more execution time for the logic stages, as desired.

As illustrated in FIG. 3, the values for first validator 22 are illustrated as binary, either 0 and 1, and indicate whether a datum in original input 21 is correct or not. As illustrated, first validator 22 changes from value 0 to value 1 at datum, and changes back from 1 to 0 at datum H. First validator 22 also changes from value 0 to 1 at datum I, and back to value 0 at datum O. Thus, as discussed above, data B and C are invalid, while data from D to E are correct. As seen from second validator 32, in this example, the entire asterisk group of data, datum A and datum B, must be processed using both stages of logic. Thus, both asterisk data flow through first register 23, second register 33 and to correct output 60. After proceeding through these two stages of logic, the asterisk data are output at correct output 60 three cycles after they received at original input 21, at read cycle point E and F.

Data F and G are detected in first stage logic 20 to be error free, while datum H requires processing through second stage logic 30. Data F and G need no processing and may be diverted directly through to correct output 60, at G and H, and the order of each datum in the data stream is maintained. Because H requires additional processing, data I and J, the data directly following data H, must be processed to maintain this order. Thus, data H, I, and J flow through first register 23, second register 33 and to correct output 60. After proceeding through these two stages of logic, these data are output at correct output 60 three cycles after they received at original input 21, at read cycle points K to M. In this scenario, datum L is error free but, if diverted directly through to correct output 60 a single read cycle later, would result in datum L being output at read cycle point M. However, because prior data H, I and J were processed through two logic stages, a datum is already resident at M. Thus, datum L is preferably processed through first stage logic 20 so that ordering of data in the data stream presented at original input 21 is maintained. Thus, datum L is processed through a stage of logic, and output at N. Datum N is detected in first stage logic 20 to be error free, while datum O requires processing through first stage logic 20. As a result, datum N is output to correct output 60 a single read cycle later, at read cycle point O. Datum O is processed through first register 23 and output to correct output 60 two read cycles after receipt at original input 21, at read cycle point Q. Corrected output 60 illustrated corrected data in the input data stream in the same order, although there may be different or fewer gaps between individual datum. As illustrated, correct output 60 comprises data between read cycle point E to Q.

While the invention has been particularly shown and described by the foregoing detailed description, it will be understood by those skilled in the art that various other changes in form and detail may be made without departing from the spirit and scope of the invention.

What is claimed is:

1. An error correction code method, comprising:
    detecting an error in a first data word;
    directing the first data word through a processing pipeline having a plurality of processing stages;
    performing an error correction code algorithm via each of the processing stages;

correcting the error via at least one of the processing stages; and bypassing at least one of the processing stages with the first data word in response to a determination that the error has been corrected.

2. The method of claim 1, further comprising determining a number of processing stages necessary to correct the error, wherein the bypassing is based on the determining.

3. The method of claim 2, further comprising maintaining order of the first data word relative to a second data word by directing the first data word through at least a one of the processing stages after correction of the error.

4. The method of claim 1, wherein the data error comprises one of the group consisting of random bit error, burst error, and erasure error.

5. The method of claim 1, further comprising receiving the first data word from a source comprising one of the group consisting of a dynamic random access memory (DRAM), a network element, and a disk drive.

6. The method of claim 1, further comprising determining a location of a second data word within the processing pipeline, wherein the bypassing is based on the determining.

7. An error correction code system, comprising:
a plurality of error correction code (ECC) processing stages; and
stage select logic coupled to each of the plurality of ECC processing stages and operable to:
enable at least one of the ECC processing stages to process a first data word in response to a determination that the data word contains an error;
examine a validator from one of the ECC processing stages, the validator indicating whether the first data word currently contains an error
direct the first data word through at least one subsequent ECC processing stage to a corrected output if the validator indicates that the first data word currently contains an error; and
direct the first data word to the corrected output, thereby bypassing the at least one subsequent ECC processing stage, if the validator indicates that the first data word does not currently contain an error.

8. The system of claim 7, wherein the first data word originates from a source comprising one of the group consisting of a dynamic random access memory (DRAM), a network element, and a disk drive.

9. The system of claim 7, wherein the stage select logic is further operable to determine a number of the plurality of ECC processing stages necessary to correct an error in the first data word and to determine whether to bypass the at least one subsequent ECC processing stage based on the number.

10. The system of claim 9, wherein the stage select logic is further operable to maintain order of the first data word with respect to a second data word by directing the first data word through at least one of the ECC processing stages after each error in the data word has been corrected.

11. The system of claim 7, wherein the stage select logic is further operable to cause a notification to be sent if an error cannot be corrected.

12. The system of claim 7, wherein at least one of the plurality of ECC processing stages comprises first stage logic and a first register.

13. Error correction logic, comprising:
a plurality of validator inputs, each of the plurality of validator inputs indicating whether a first data word in a data pipeline comprising a plurality of processing stages is valid, the first data word containing an error correctable via processing by at least one of the processing stages; and stage select logic coupled to each of the plurality of processing stages operable to receive a validator value at each of the plurality of validator inputs and to determine when the error has been corrected by the processing stages based on the validator inputs;
direct the first data word through at least one subsequent processing stage to a corrected output if the validator value at one of the validator inputs indicates an error; and
direct the first data word to the corrected output, thereby bypassing the at least one subsequent processing stage, if the validator value at the one validator input does not indicate an error.

14. The logic of claim 13, wherein at least one of the plurality of validator inputs has a value one if it does not indicate an error.

15. The logic of claim 13, wherein the stage select logic is further operable to direct processing of the first data word if the validator value at the one validator input indicates an error by latching the first data word in the at least one subsequent processing stage.

16. The logic of claim 13, wherein the first data word originates from a source comprising one of the group consisting of a dynamic random access memory (DRAM), a network element, and a disk drive.

17. The logic of claim 13, wherein the stage select logic is further operable to determine a number of processing stages necessary to correct an error and direct the first data word through the processing stages based on the number.

18. The logic of claim 13, wherein the stage select logic is further operable to maintain order of the first data word with respect to a second data word by directing the first data word through at least one of the plurality of processing stages after each error in the first data word has been corrected.

19. The logic of claim 13, wherein the stage select logic is further operable to cause a notification to be sent if an error cannot be corrected.

20. An error correction code system, comprising:
a processing pipeline having a plurality of error correction code (ECC) processing stages; and
logic configured to detect an error in a first data word and to enable a first one of the ECC processing stages to process the first data word in response to a detection of the error, the logic further configured to determine when the error is corrected by the processing pipeline and to cause the first data word to bypass at least one of ECC processing stages if the error has been corrected before the first data word reaches the at least one ECC processing stage.

21. The system of claim 20, wherein the logic is further configured to detect an error in a second data word and to enable the first one of the ECC processing stages to process the second data word, the logic further configured to enable the at least one ECC processing stage to process the second data word in response to a determination that the error in the second data word has not been corrected before the second data word reaches the at least one ECC processing stage.

22. The system of claim 20, wherein the logic is further configured to determine a location of a second data word within the processing pipeline, and wherein the logic is configured to determine whether to allow the first data word to bypass the at least one ECC processing stage based on the location of the second data word.

* * * * *

UNITED STATES PATENT AND TRADEMARK OFFICE
CERTIFICATE OF CORRECTION

PATENT NO.          : 7,350,127 B2
APPLICATION NO. : 10/735128
DATED                  : March 25, 2008
INVENTOR(S)       : Darel N. Emmot et al.

Page 1 of 1

It is certified that error appears in the above-identified patent and that said Letters Patent is hereby corrected as shown below:

In column 7, line 10, in Claim 3, after "least" delete "a".

In column 7, line 31, in Claim 7, after "error" insert -- ; --.

Signed and Sealed this

Fifth Day of August, 2008

JON W. DUDAS
*Director of the United States Patent and Trademark Office*